(12) United States Patent
Gill

(10) Patent No.: US 6,456,469 B1
(45) Date of Patent: Sep. 24, 2002

(54) BUFFER LAYER OF A SPIN VALVE STRUCTURE

(75) Inventor: Hardayal Singh Gill, Portola Valley, CA (US)

(73) Assignee: International Business Machines Corporation, Armonk, NY (US)

( * ) Notice: Subject to any disclaimer, the term of this patent is extended or adjusted under 35 U.S.C. 154(b) by 32 days.

(21) Appl. No.: 09/587,272

(22) Filed: Jun. 5, 2000

(51) Int. Cl.[7] .................... G11B 5/127; G11B 5/33
(52) U.S. Cl. ................................................ 360/324.11
(58) Field of Search ..................... 360/324.11, 324.1, 360/324, 313, 110

(56) References Cited

U.S. PATENT DOCUMENTS

| | | | |
|---|---|---|---|
| 5,432,734 A | * 7/1995 | Kawano et al. | 324/252 |
| 5,768,071 A | 6/1998 | Lin | 360/324.11 |
| 5,784,225 A | 7/1998 | Saito et al. | 29/603.14 |
| 5,793,279 A | 8/1998 | Nepela | 338/32 R |
| 5,869,963 A | 2/1999 | Saito et al. | 324/252 |
| 5,876,848 A | 3/1999 | Tan et al. | 428/336 |
| 5,898,549 A | * 4/1999 | Gill | 360/324.11 |
| 6,046,892 A | * 4/2000 | Aoshima et al. | 360/324.11 |
| 6,141,191 A | * 10/2000 | Lee et al. | 360/324.1 |
| 6,208,491 B1 | * 3/2001 | Pinarbasi | 360/324.1 |
| 6,277,505 B1 | * 8/2001 | Shi et al. | 428/692 |
| 6,278,592 B1 | * 8/2001 | Xue et al. | 360/324.12 |
| 2002/0024780 A1 | * 2/2002 | Mao et al. | 360/324.11 |

FOREIGN PATENT DOCUMENTS

DE 19848776 A1 4/1999

* cited by examiner

Primary Examiner—Robert S. Tupper
Assistant Examiner—Julie Anne Watko
(74) Attorney, Agent, or Firm—Kunzler & Associates

(57) ABSTRACT

A spin valve sensor achieves a high GMR coefficient through the use of a buffer layer inserted between the anti ferromagnetic (AFM) and first anti-parallel (AP) pinned layer. The buffer layer is preferably formed of a NiFeX alloy, where X is selected from elements including Nb, Mo, Cr, and Ta. The buffer layer a decreases degradation of a pinning field that occurs when the materials of the AFM layer and first AP-pinned layer intermix during an annealing process. The NiFeX buffer layer provides a buffer to the intermixing of the AFM and first AP-pinned layers. The buffer layer of the present invention is preferably formed with a strong face-centered cubic (FCC) texture having a (111) crystallographic plane parallel to an underlying substrate. A Mn based alloy antiferromagnetic layer and a CoFe AP-pinned layer may be used together with the buffer layer.

24 Claims, 6 Drawing Sheets

BUFFER LAYER OF A SPIN VALVE STRUCTURE

BACKGROUND OF THE INVENTION

1. The Field of the Invention

The present invention relates generally to spin valve magnetic transducers for reading information signals from a magnetic medium and, in particular, to buffer layers for preventing diffusion in a spin valve sensor, and to magnetic recording systems which incorporate such sensors.

2. The Relevant Art

Computer systems generally utilize auxiliary memory storage devices having media on which data can be written and from which data can be read for later use. A direct access storage device, such as a disk drive, incorporating rotating magnetic disks is commonly used for storing data in magnetic form on the disk surfaces. Data is recorded on concentric, radially spaced tracks on the disk surfaces. Magnetic heads carrying read sensors are then used to read data from the tracks on the disk surfaces.

In high capacity disk drives, magnetoresistive read sensors, commonly referred to as MR heads, are now the most common type of read sensors. This is largely due to the capability of MR heads of reading data on a disk of a greater linear density than that which the previously used thin film inductive heads are capable of. An MR sensor detects a magnetic field through a change in resistance in its MR sensing layer (also referred to as an "MR element") as a function of the strength and direction of the magnetic flux being sensed by the MR layer.

The conventional MR sensor operates on the basis of the anisotropic maonetoresistive (AMR) effect in which an MR element resistance varies as the square of the cosine of the angle between the magnetization of the MR element and the direction of sense current flowing through the MR element. Recorded data can be read from a magnetic medium because the external magnetic field from the recorded magnetic medium (the signal field) causes a change in the direction of magnetization in the MR element, which in turn causes a change in resistance in the MR element and a corresponding change in the sensed current or voltage.

Another type of MR sensor is the giant magnetoresistance (GMR) sensor manifesting the GMR effect. In GMR sensors, the resistance of the MR sensing layer varies as a function of the spin-dependent transmission of the conduction electrons between magnetic layers separated by a non-magnetic layer (spacer) and the accompanying spin-dependent scattering which takes place at the interface of the magnetic and non-magnetic to layers and within the magnetic layers.

GMR sensors using only two layers of ferromagnetic material separated by a layer of non-magnetic electrically conductive material are generally referred to as spin valve (SV) sensors manifesting the GMR effect. In an SV sensor, one of the ferromagnetic layers, referred to as the pinned layer, has its magnetization typically pinned by exchange coupling with an antiferromagnetic (e.g., NiO or Fe—Mn) layer.

The magnetization of the other ferromagnetic layer, referred to as the free layer, however, is not fixed and is free to rotate in response to the field from the recorded magnetic medium (the signal field). In SV sensors, the SV effect varies as the cosine of the angle between the magnetization of the pinned layer and the magnetization of the free layer. Recorded data can be read from a magnetic medium because the external magnetic field from the recorded magnetic medium causes a change in the direction of magnetization in the free layer, which in turn causes a change in resistance of the SV sensor and a corresponding change in the sensed current or voltage. It should be noted that the AMR effect is also present in the SV sensor free layer and it tends to reduce the overall GMR effect.

FIG. 1 shows a typical prior art SV sensor 100 comprising a pair of end regions 104 and 106 separated by a central region 102. The central region 102 is formed by a suitable method such as sputtering and has defined end regions that are contiguous with and abut the edges of the central region. A free layer (free ferromagnetic layer) 110 is separated from a pinned layer (pinned ferromagnetic layer) 120 by a non-magnetic, electrically-conducting spacer layer 115. The magnetization of the pinned layer 120 is fixed through exchange coupling with an anti ferromagnetic (AFM) layer 121.

The free layer 110, spacer layer 115, pinned layer 120 and AFM layer 121 are all formed in the central region 102. Hard bias layers 130 and 135 formed in the end regions 104 and 106, respectively, provide longitudinal bias for the free layer 110. Leads 140 and 145 formed over hard bias layers 130 and 135, respectively, provide electrical connections for the flow of the sensing current $I_s$ from a current source 160 to the MR sensor 100. A sensing device 170 connected to the leads 140 and 145 senses the change in the resistance due to changes induced in the free layer 110 by an external magnetic field (e.g., a field generated by a data bit stored on a disk). IBM's U.S. Pat. No. 5,206,590 granted to Dieny et al. and incorporated herein by reference, discloses an MR sensor operating on the basis of the SV effect.

Another type of spin valve sensor more recently developed is an anti-parallel (AP)-pinned spin valve sensor. FIG. 2 shows one representative AP-pinned SV sensor 200. The AP-pinned SV sensor 200 has a pair of end regions 202 and 204 separated from each other by a central region 206. The AP-pinned SV sensor 200 is also shown comprising a Ni—Fe free layer 225 separated from a laminated AP-pinned layer 210 by a copper spacer layer 220. The magnetization of the laminated AP-pinned layer 210 is fixed by an AFM layer 208 which is made of NiO.

The laminated AP-pinned layer 210 includes a first ferromagnetic layer 212 of cobalt and a second ferromagnetic layer 216 of cobalt separated from each other by a ruthenium (Ru) antiparallel coupling layer 214. The AFM layer 208, AP-pinned layer 210, copper spacer 220, free layer 225 and a cap layer 230 are all formed sequentially in the central region 206. A pair of hard bias layers 235 and 240, formed in the end regions 202 and 204, provide longitudinal biasing for the free layer 225.

A pair of electrical leads 245 and 250 are also formed in end regions 202 and 204, respectively, to provide electrical current from a current source (not shown) to the SV sensor 200. In the depicted example, the magnetization direction of the free layer 225 is set parallel to the air bearing surface (ABS) in the absence of an external field. The magnetization directions of the pinned layers 212 and 214, respectively, are also set to be perpendicular to the ABS. The magnetization directions of the pinned layers are shown as coming out of the Figure at 260 and going in at 255. The magnetization of the free layer 225 is shown set to be parallel to the ABS.

The disk drive industry has been engaged in an ongoing effort to increase the overall sensitivity, or GMR coefficient, of the SV sensors in order to permit the drive head to read smaller changes in magnetic flux. Higher GMR coefficients enable the storage of more bits of information on any given disk surface and ultimately provide for higher capacity disk drives without increased size or complexity of the disk drives. The GMR coefficient of an SV sensor is ΔR/R, or the change in resistance of the sensor material, divided by the overall resistance of the material when the sensor material is subjected to a changing magnetic field. The GMR coefficient is dependent on both the "softness" of the material and its overall resistance.

A change in resistance of the sensor material can be easily measured only if the change is large compared to the overall resistance R of the material. Thus, a low overall resistance R, combined with a high change in magnetoresistance, ΔR, will produce a high GMR coefficient.

Other properties relevant to the performance of a GMR head include magnetostriction, exchange coupling between the AFM and the pinned layer or layers, and the electrical resistivity of the AFM. Magnetostriction is a measure of the stress or deformation of a material when it undergoes a change in magnetism. It is desired in the construction of spin valves to keep magnetostriction to a minimum because deformation of the GMR head materials can cause poor interfacing between layers and nonlinear performance as magnetic flux changes.

Exchange coupling between the AFM and the pinned layers is important because magnetic flux from the AFM must reach the pinned layer with a minimum of reluctance or leakage in order to keep the magnetic moment of the pinned layer at a consistent orientation. An inadequate exchange coupling may cause poor pinning, thereby reducing the sensitivity of the GMR head.

It is also vital that the current through the spin valve sensor be confined to the pinned and sensing portions of the spin valve sensor. If current is permitted to shunt through the AFM layer, the magnetoresistance recorded by the sensor will be artificially low, thus producing a lower GMR coefficient and a nonlinear signal. Thus, the material selected for the AFM layer must possess a high electrical resistivity in order to prevent shunting.

Prior art drive heads have been produced by forming a seed or buffer layer on or near the substrate, and then forming the remaining layers on top of the seed layer. The crystalline structure and orientation of the seed layer determine the configuration of the remaining layers. Materials such as NiFe have previously been used to form all or part of the seed layer.

Recently, magnesium alloys such as PtMn have been used to form the AFM layer. The Mn alloys exhibit strong exchange coupling properties and allow for thinner AFM layers to be used. This provides greater freedom for increasing the number or thickness of other layers without substantially increasing the area of the spin valve sensor.

Nevertheless, when spin valve sensors are formed of materials such as PtMn, annealing at high temperatures is required. This annealing process creates other problems that can affect the performance of the spin valve sensor. These problems include degradation of the pinning field, intermixing of the elements that comprise the pinned and free layers, and an undesirably low resistance in non-sensing layers. The prior art has attempted to reduce the degradation of the pinning field as a function of temperature by using a PtMn AFM/NiFe free layer as opposed to a PtMn AFM/Co free layer. Nevertheless, even in sensors with this composition, some degradation continues to occur.

From the above discussion, it can be seen that it would be beneficial to further improve the GMR coefficient of current spin valve sensors by providing a more substantial decrease in the degradation of the pinning field during annealing and raising the resistivity to the shunt current that flows between the pinned layer and the free layer.

OBJECTS AND BRIEF SUMMARY OF THE INVENTION

The apparatus of the present invention has been developed in response to the present state of the art, and in particular, in response to the problems and needs in the art that have not yet been fully solved by currently available spin valve sensors. Accordingly, it is an overall object of the present invention to provide an improved spin valve sensor that overcomes many or all of the above-discussed shortcomings in the art.

To achieve the foregoing object, and in accordance with the invention as embodied and broadly described herein in the preferred embodiment, an improved spin valve sensor is provided. The spin valve sensor of the present invention in one embodiment comprises a buffer layer positioned between a pinned layer of ferromagnetic material and an antiferromangentic (AFM) layer. The AFM layer may be formed of a Mn alloy such as PtMn. The buffer layer is preferably formed of an NiFeX alloy where X is an element selected to decrease the degradation of the pinning field as a function of temperature, decrease the intermixing of the materials in the AFM and pinned layers and to act as a barrier to shunt currents flowing between the AFM and pinned layers. The element X in one embodiment is selected from the group consisting of Nb, Mo, Cr, and Ta.

The spin valve sensor may comprise a cap layer, a free layer, a pinned layer of ferromagnetic material as discussed above, an antiferromagnetic (AFM) layer, a substrate, and a seed layer. In one embodiment, the AFM layer is formed of an alloy containing Mn and the pinned layer(s) are formed of Co or CoFe. Nevertheless, the buffer layer of the present invention is intended for use with any type of spin valve sensor having a construction favorable to the use of a buffer layer that prevents diffusion during annealing.

The spin valve sensor of the present invention may be incorporated within a disk drive system comprising a magnetic recording disk; an anti-parallel (AP)-pinned spin valve (SV) sensor configured in the manner discussed above; an actuator for moving the spin valve sensor across the magnetic recording disk so the spin valve sensor may access different regions of magnetically recorded data on the magnetic recording disk; and a detector. The detector may be electrically coupled to the spin valve sensor for detecting changes in resistance of the sensor caused by rotation of the magnetization axis of the free ferromagnetic layer relative to the fixed magnetizations of the AP-pinned layer in response to magnetic fields from the magnetically recorded data.

These and other objects, features, and advantages of the present invention will become more fully apparent from the following description and appended claims, or may be learned by the practice of the invention as set forth hereinafter.

BRIEF DESCRIPTION OF THE DRAWINGS

In order that the manner in which the above-recited and other advantages and objects of the invention are obtained will be readily understood, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

Figure 3:
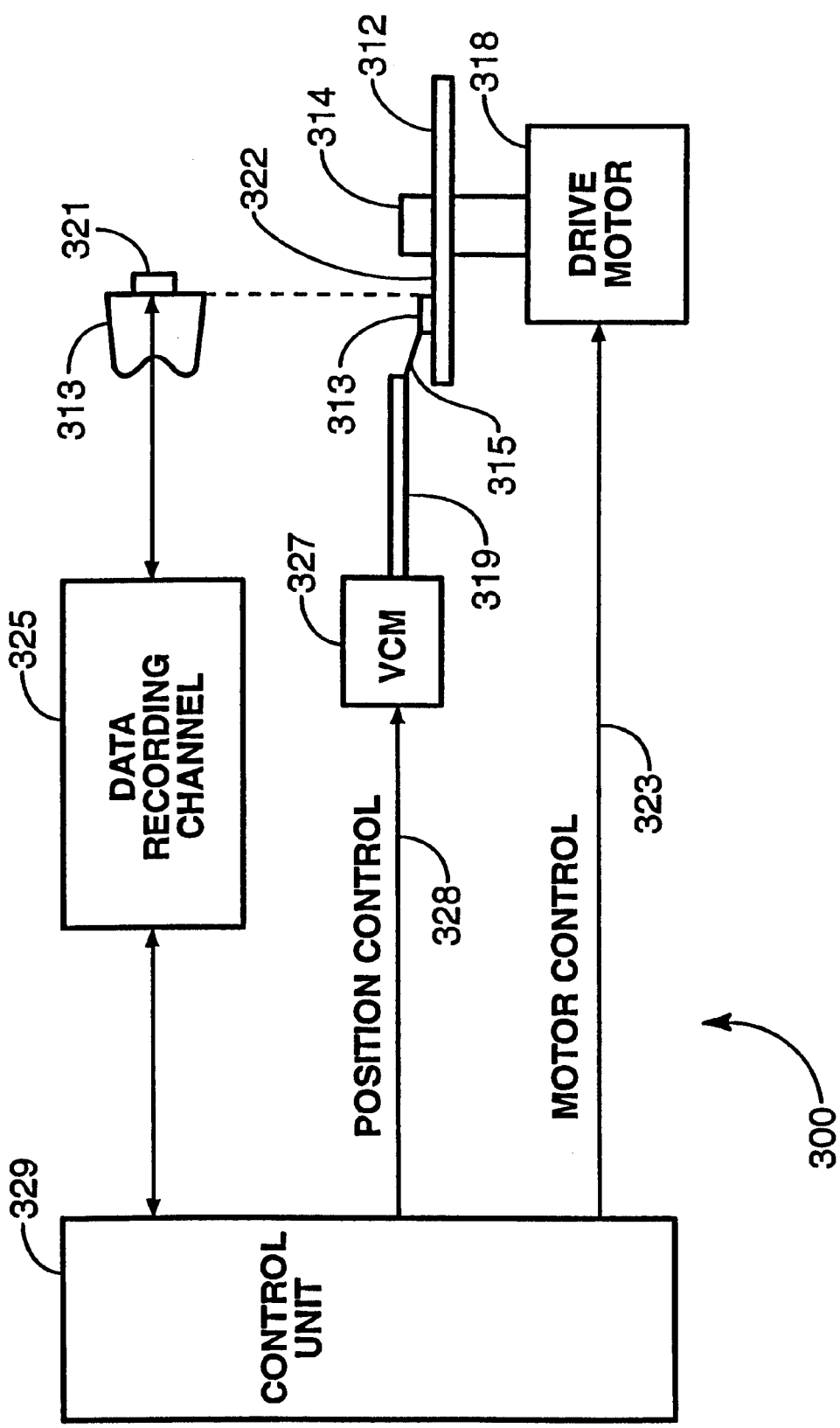
FIG. 3 is a schematic block diagram illustrating one embodiment of a magnetic recording disk drive system of the present invention.

FIG. 3 shows one example of a disk drive 300 embodying the present invention. As shown in FIG. 3, the disk drive 300 comprises at least one rotatable magnetic disk 312 supported on a spindle 314 and rotated by a disk drive motor 318. The magnetic recording media on each magnetic disk 312 is in the form of concentric, annular data tracks (not shown).

At least one slider 313 is positioned on the disk 312. Each slider 313 supports one or more magnetic read/write heads 321 incorporating the GMR sensor of the present invention. As the disks rotate, the slider 313 is moved radially in and out over the disk surface 322 so that the heads 321 may access different portions of the magnetic disk 312 where desired data is recorded. Each slider 313 is attached to an actuator arm 319 by means of a suspension 315. The suspension 315 provides a slight spring force which biases the slider 313 against the disk surface 322. Each actuator arm 319 is attached to an actuator 327.

The actuator 327 as shown in FIG. 3 may be a voice coil motor (VCM). The VCM comprises a coil movable within a fixed magnetic field, and the direction and speed of the coil movements are controlled by the motor current signals supplied by a controller 329.

During operation of the disk storage system, the rotation of the magnetic disk 312 generates an air bearing between the slider 313 (the surface of the slider 313, which includes head 321 and faces the surface of disk 312, is referred to as an air bearing surface (ABS)) and the disk surface 322 which exerts an upward force or lift on the slider 313. The air bearing thus counter-balances the slight spring force of the suspension 315 and supports the slider 313 off and slightly above the disk surface by a small, substantially constant spacing during normal operation.

The various components of the disk storage system are controlled in operation by control signals generated by the control unit 329. The control signals include access control signals and internal clock signals. Typically, the control unit 329 comprises logic control circuits, storage means, and a microprocessor. The control unit 329 generates control signals to control various system operations such as drive motor control signals on a line 323 and head position and seek control signals on a line 328. The control signals on the line 328 provide the desired current profiles to optimally move and position the slider 313 to the desired data track on the disk 312. Read and write signals are communicated to and from the read/write heads 321 by means of a recording channel 325. In the depicted embodiment, the read/write heads 321 incorporate a GMR sensor including a spin valve of the present invention.

Figure 4:
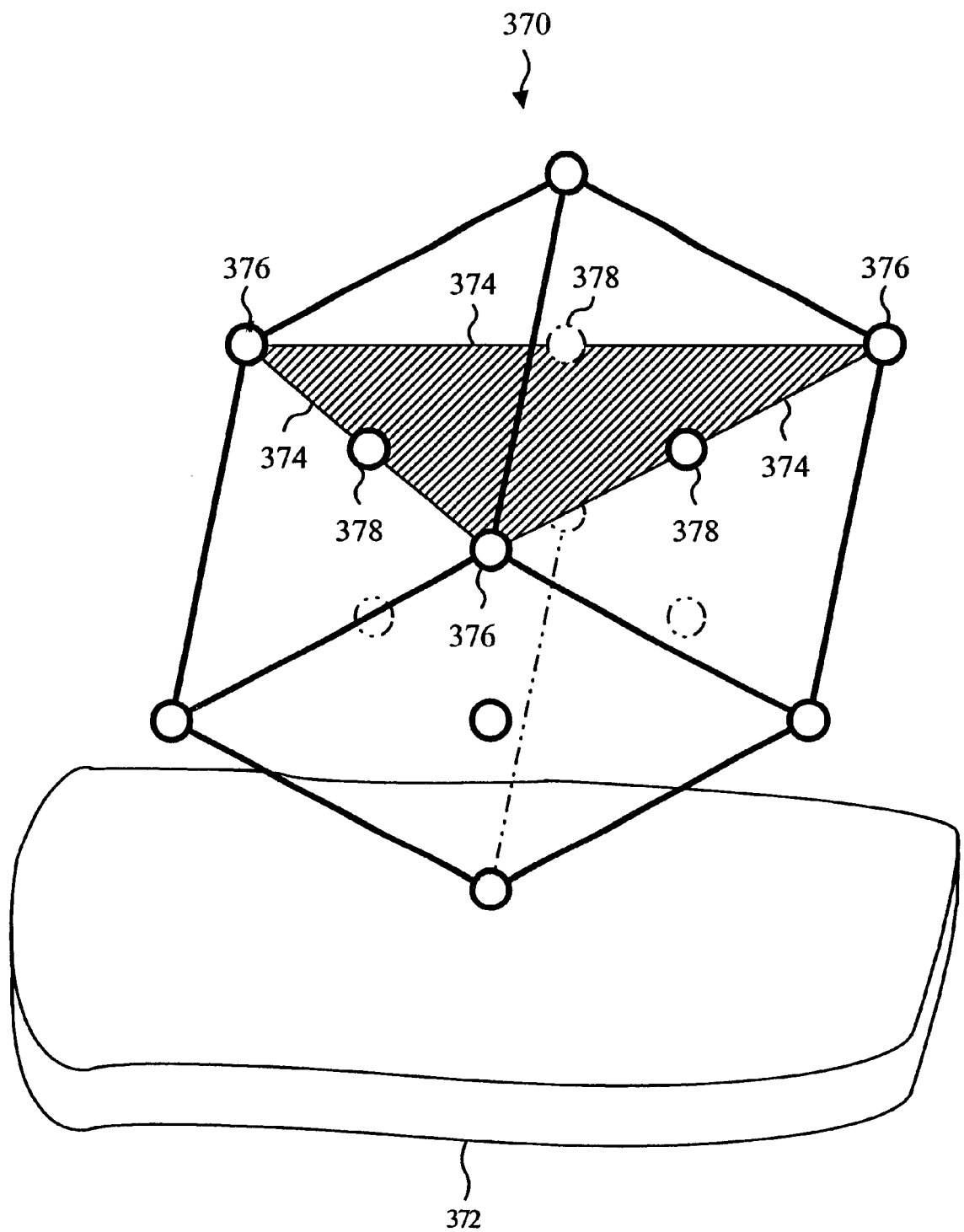
FIG. 4 is a perspective view of a microscopic portion of a face centered cubic (FCC) seed layer for an SV head according to the invention, with a (111) plane parallel to the substrate of the head.

Referring to FIG. 4, many of the materials used in the read/write heads 321 have an FCC, or Face-Centered Cubic, structure. It has been discovered that atoms in an FCC structure are most tightly and consistently arranged along the (111) crystallographic plane. Thus, the read/write head 321 is believed to function optimally when the FCC materials in the read/write head 321 are oriented so that the (111) plane is parallel to the substrate. In FIG. 4, a cube-shaped sample 370 of FCC material is shown positioned over a substrate 372. The (111) plane 374 is positioned parallel to the substrate. Three corner atoms 376 and three face-centered atoms 378 within the cube-shaped sample 370 are located within the (111) plane 374, and are spaced apart relatively evenly, with small distances between adjacent atoms.

When the (111) plane 374 is exposed to form an interface for subsequent layers, the crystalline structures of the new layers are formed in alignment with that of the seed layer. Interfaces between layers have few discontinuities (misaligned sets of atoms) or interstices (open spaces where atoms should be). Consequently, the (111) plane 374 is an effective foundation for the growth of tightly bonded, even-textured layers.

Furthermore, layer textures are improved when the lattice constants of adjacent layers are similar. The lattice constant of a crystalline material is defined as the smallest distance between adjacent atoms in a crystal. Similar lattice constants permit the crystals of adjacent layers to align with each other to produce a homogeneous grain boundary with few irregularities.

Figure 1:
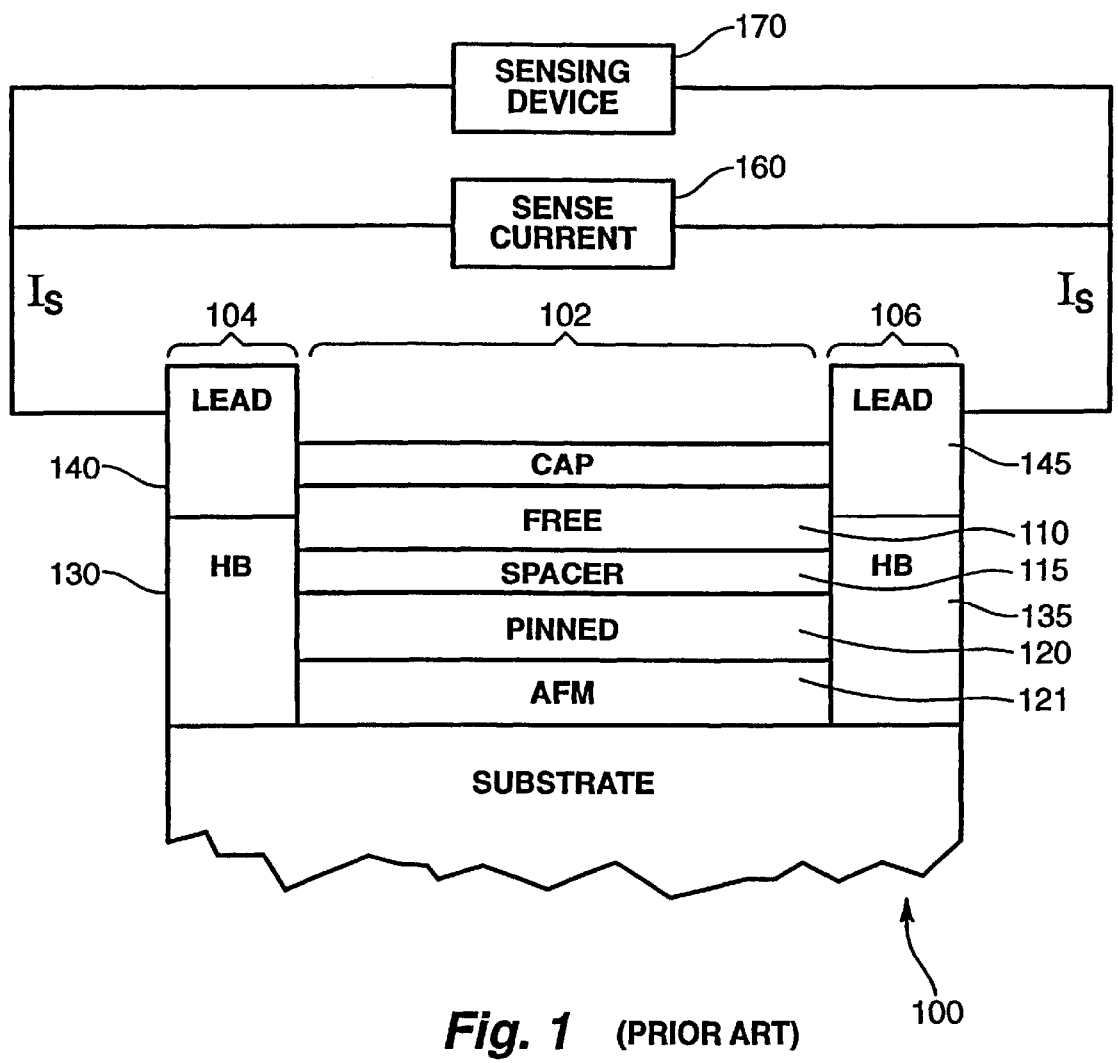
FIG. 1 is a cross-sectional view illustrating the composition of a spin valve sensor of the prior art.
Figure 2:
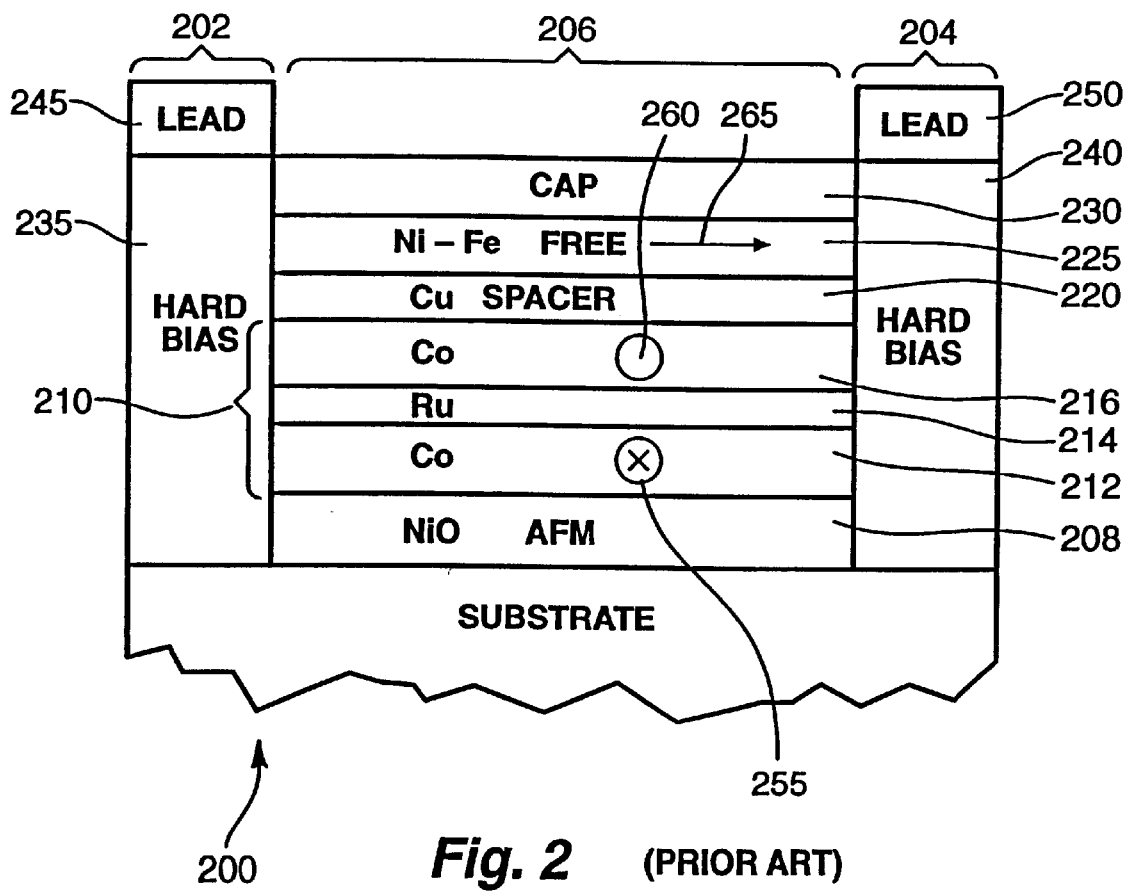
FIG. 2 is a cross-sectional view illustrating the composition of an AP-pinned spin valve sensor of the prior art.
Figure 5:
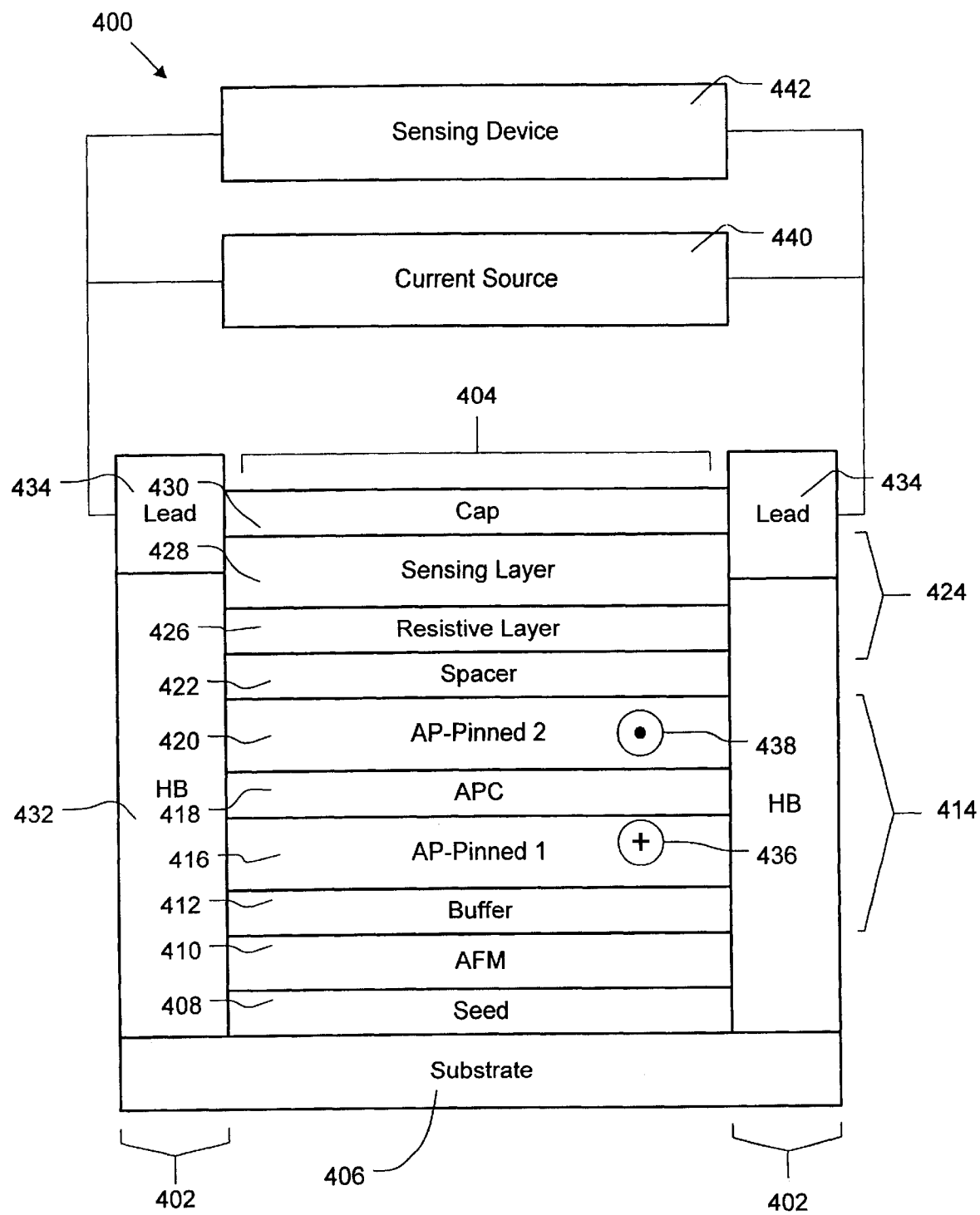
FIG. 5 is a cross-sectional view illustrating the composition of one embodiment of a bottom AFM spin valve sensor incorporating a buffer layer according to the present invention.

FIG. 5 shows an air bearing surface (ABS) view of one embodiment of a spin valve 400 of the present invention. The spin valve 400 is formed with an added buffer layer between the antiferromagnetic layer and free layer according to the present invention. While an AP-pinned spin valve sensor 400 is depicted, and is preferred for use with the added buffer layer of the present invention, nevertheless, the added buffer layer of the present invention may also be used with other types of spin valve sensors, such as the simple spin valve sensor 100 of FIG. 1.

The spin valve sensor 400 of FIG. 5 is shown with a pair of end regions 402 separated from each other by a central region 404. The central region 404 has defined edges where the end regions 402 form a contiguous junction with and abut the edges. The sensor 400 is built upon a substrate 406 which may be any suitable material, including glass, semiconductor material, or a ceramic material, such as alumina ($AL_2O_3$). The substrate 406 may also comprise a shield layer and a gap layer as is known to those skilled in the art. In the following description, "above" means further from the substrate 406 and "below" means closer to the substrate. Likewise, "bottom" layers are those closest to the substrate 406, and the "top" layers are those furthest from the substrate 406.

A seed layer 408 is preferably formed on top of the substrate 406. The seed layer 408 may be configured in a number of different ways according to the invention. The primary function of the seed layer 408 is to form a foundation for the growth of the layers on top of it. Thus, it is preferred under the present invention that the materials used to form the seed layer 408 have an FCC structure that forms with a (111) plane parallel to the substrate 406, as described in connection with FIG. 4. It has been discovered that if the (111) plane of the seed layer is parallel to the substrate 406, subsequent FCC layers formed over the seed layer 406 will form with a consistent crystalline structure and orientation. The seed layer 408 has a thickness ranging from about 25 Å to 65 Å, and a more preferred thickness of about 40 Å.

An antiferromagnetic (AFM) layer 410 is preferably formed over the seed layer 408 in the central region 404. Alternatively, the AFM layer 410 may be formed in both the central region 404 as well as the end regions 402. The AFM layer 410 is preferably formed of a Manganese based alloy and may be selected from the group consisting of PtMn, NiMn, PtPdMn, and PtCrMn. The AFM layer 410 is preferable formed with a thickness in a range of between about 100 Å and about 250 Å with a preferred thickness of about 150 Å when PtMn, PtPdMn or PtCrMn alloys are used to form the AFM layer 410. The AFM layer 410 has a thickness in the range of between about 200 Å and about 300 Å with a preferred thickness of about 250 Å when an NiMn alloy is used to form the AFM layer 410.

A buffer layer 412 is shown formed above the AFM layer 410 in the central region 404. The buffer layer 412 is preferably formed of a NiFe alloy selected from the group consisting of NiFeNb, NiFeMo, NiFeCr and NiFeTa. The buffer layer 412 has a thickness preferably in the range of between about 3 Å and about 25 Å, with a more preferred thickness in the range of about 5 Å to about 20 Å, and a most preferred thickness of about 10 Å. The thicknesses mentioned are applicable to any NiFeX alloy mentioned above.

The addition of the buffer layer 412 provides several advantages over spin valve sensors currently available. Employing the buffer layer 412 formed of an NiFe alloy from the group enumerated above results in a significantly increased GMR coefficient of the spin valve sensor 400. Furthermore, this increase is achieved without having to decrease the temperature used during the annealing process.

The degradation of the pinning field has been observed to be caused by intermixing (or diffusion) that occurs during the annealing process between the materials that form the AFM layer and pinned layer of currently available spin valve sensors. The introduction of a buffer layer 412 as configured under the present invention substantially decreases the degradation of the pinning field, allowing for an increased GMR coefficient of the spin valve sensor 400. Also, the addition of the buffer layer 412 comprised of an NiFe alloy decreases the flow of shunt currents between the AFM layer 410 and the pinned layer 414. This decrease in the shunt current is due to the high resistivity of the NiFe alloy. Finally, the addition of the buffer layer 414 provides a strong FCC structure which creates a strong diffusion barrier between the AFM layer 410 and the pinned layer 414.

A laminated anti-parallel (AP)-pinned layer 414 is shown formed over the buffer layer 412 in FIG. 5. In the depicted embodiment, the AP-pinned layer 414 is formed of a first AP-pinned layer 416 and a second AP-pinned layer 420. Alternatively, a single pinned layer, similar to layer 120 of FIG. 1 could be used in place of the laminated AP-pinned layer 414. In the depicted embodiment, the first and second AP-pinned layers 416 and 420 are separated from each other by an anti-parallel coupling (APC) layer 418 which is preferably formed of a nonmagnetic material that provides strong antiferromagnetic coupling between the first and second AP-pinned layers 416 and 420.

While any suitable nonmagnetic material may be used to form the anti-parallel coupling layer 418, Ru is preferred. The first and second AP-pinned layers 416 and 420 may include suitable materials such as Fe and Co. For example, the first AP-pinned layer 416 may be a layer of Co or CoFe deposited on and in contact with the buffer layer 412. The second AP-pinned layer 420 may also be Co or CoFe. Preferably, the first AP-pinned layer 416 is pinned in a direction 438 opposite the direction 436 of the second AP-pinned layer 420.

When CoFe is used to form the first and second AP-pinned layers 416 and 420, the entire pinned layer 414 preferably has a thickness in a range of between about 24 Å and about 70 Å, and more preferably has a thickness of about 51 Å. The first AP-pinned layer 416 has a thickness preferably in the range of between about 10 Å and about 30 Å, with a more preferred thickness in the range of between about 15 Å to about 20 Å, and a most preferred thickness of about 17 Å. The second AP-pinned layer 420 has a thickness preferably in the range of between about 10 Å and about 30 Å, with a more preferred thickness in the range of between about 20 Å to about 28 Å, and a most preferred thickness of about 26 Å. The thickness of the APC layer 418 is preferably in the range of between about 4 Å and about 10 Å, with a more preferred range of between about 6 Å to about 9 Å, and a most preferred value of about 8 Å.

The thicknesses of the first and second AP-pinned layers 416 and 420 should be simultaneously adjusted because the performance of the spin valve sensor 400 depends upon the difference between them. This difference, the thickness of the first AP-pinned layer 416 subtracted from the thickness of the second AP-pinned layer 420, should be kept within the range of between about 3 Å and about 20 Å.

The spin valve sensor 400 as depicted also includes a spacer layer 422 formed over and in contact with the second AP-pinned layer 420. The spacer layer 422 is preferably formed of a GMR promoting material such as copper (Cu), although it may also be formed of other GMR promoting materials such as gold (Au) or silver (Ag). The thickness of the spacer layer 422 is preferably in the range between about 15 Å and about 30 Å, with a more preferred range of about 18 Å to about 25 Å, and a most preferred value of about 21 Å.

A free ferromagnetic layer 424 is shown formed over and adjacent to the spacer layer 422. In order to provide the advantages of the present invention, the free ferromagnetic layer 424 is preferably formed with a material having a high degree of magnetoresistance. One example of such a material is a Co—Fe alloy. Preferably, the free ferromagnetic layer 424 maintains magnetic softness $H_K$ with a structure in which the Co—Fe alloy of the free layer 424 is laminated with a second material.

In the depicted embodiment, the free layer 424 contains a resistive layer 426 and a lamination layer 428. The resistive layer 426 is preferably formed with a material having a high degree of magnetoresistance such as a Co—Fe alloy. The lamination layer 428 is preferably formed of NiFe or some similar material selected its high magnetoresistance and low magnetostriction.

Preferably, when configured with CoFe and NiFe, the free layer 424 has a total thickness in a range of between about 25 Å and about 75 Å, with a more preferred thickness in the range of between about 35 Å and about 55 Å, with the most preferred thickness being about 45 Å. Accordingly, the resistive layer 426 has a total thickness in the range of between about 5 Å and about 15 Å, with a more preferable thickness in the range of between about 10 Å and about 15 Å, with the most preferred thickness being about 15 Å. Furthermore, the lamination layer 428 has a thickness preferably in the range of between about 20 Å and about 60 Å, with a more preferable thickness in the range of between about 25 Å and about 40 Å, with the most preferred thickness being about 30 Å.

The lamination layer 428 may be comprised of materials in addition to the preferred NiFe alloy. For example, the addition of Co to the NiFe alloy has been found to substantially increase the overall magnetoresistance of the free layer 424, while not substantially decreasing the magnetic hardness $H_K$ of the free layer 424. Materials such as chromium, tantalum, rhodium, and molybdenum may also be added to the NiFe alloy to increase the resistance of the lamination layer 428 and thereby enhance the amount of current passing through the resistive layer 426.

Referring again to FIG. 5, the spin valve sensor 400 is shown with a cap layer 430 formed over the free layer 424 to protect the material deposited in the central region 404 against oxidation. The cap layer 430 is preferably made of tantalum (Ta), but of course, any suitable material may be used. The spin valve sensor 400 is also shown formed with a pair of longitudinal biasing layers 432 formed in the end regions 402. The biasing layers 432 are preferably made of a hard material such as a CoPtCr alloy and are used for longitudinally biasing the central region 404.

A pair of electrical leads 434 is also shown formed over the biasing layers 432 and are employed to form a circuit path between the spin valve sensor 400, a current source 440 and a sensing device 442. In the preferred embodiment, the sensing device 442 detects the voltage signal between the two leads 434, which changes with the changing magnetic signals on the disk.

The sensed voltage signal arises from a change in resistance, ΔR, of the central portion 404 as the magnetization direction $M_F$ of the free layer 424 rotates in response to the applied magnetic signal from the recorded medium. The sensing device may include a digital recording channel such as a partial-response maximum likelihood (PRML) channel as is known to those skilled in the art. Alternatively, the sensing device may include a peak-detect channel as is known to those skilled in the art. In one embodiment, the sensing device includes a digital recording channel of PRML type.

Preferred alloys and concentrations for the present invention may be as follows. A currently preferred example of the Co—Fe alloy for use in the first and second AP-pinned layers 416 and 420 and the resistive layer 426 is $Co_{90}Fe_{19}$. A preferred example of the Ni—Fe alloy for use in the lamination layer 428 is $Ni_{81}Fe_{19}$. Preferred examples of the Mn based alloy used in the AFM layer 410 are $Pt_{40}Mn_{60}$, $Ni_{40}Mn_{60}$, $Pt_{30}Pd_{10}Mn_{60}$ and $Pt_{30}Cr_{10}Mn_{60}$. A preferred example of the NiFeX ally used in the buffer layer 412 is $Ni_{75}Fe_{18}X_7$ where X is selected from the group consisting of Nb, Mo, Cr and Ta.

Figure 6:
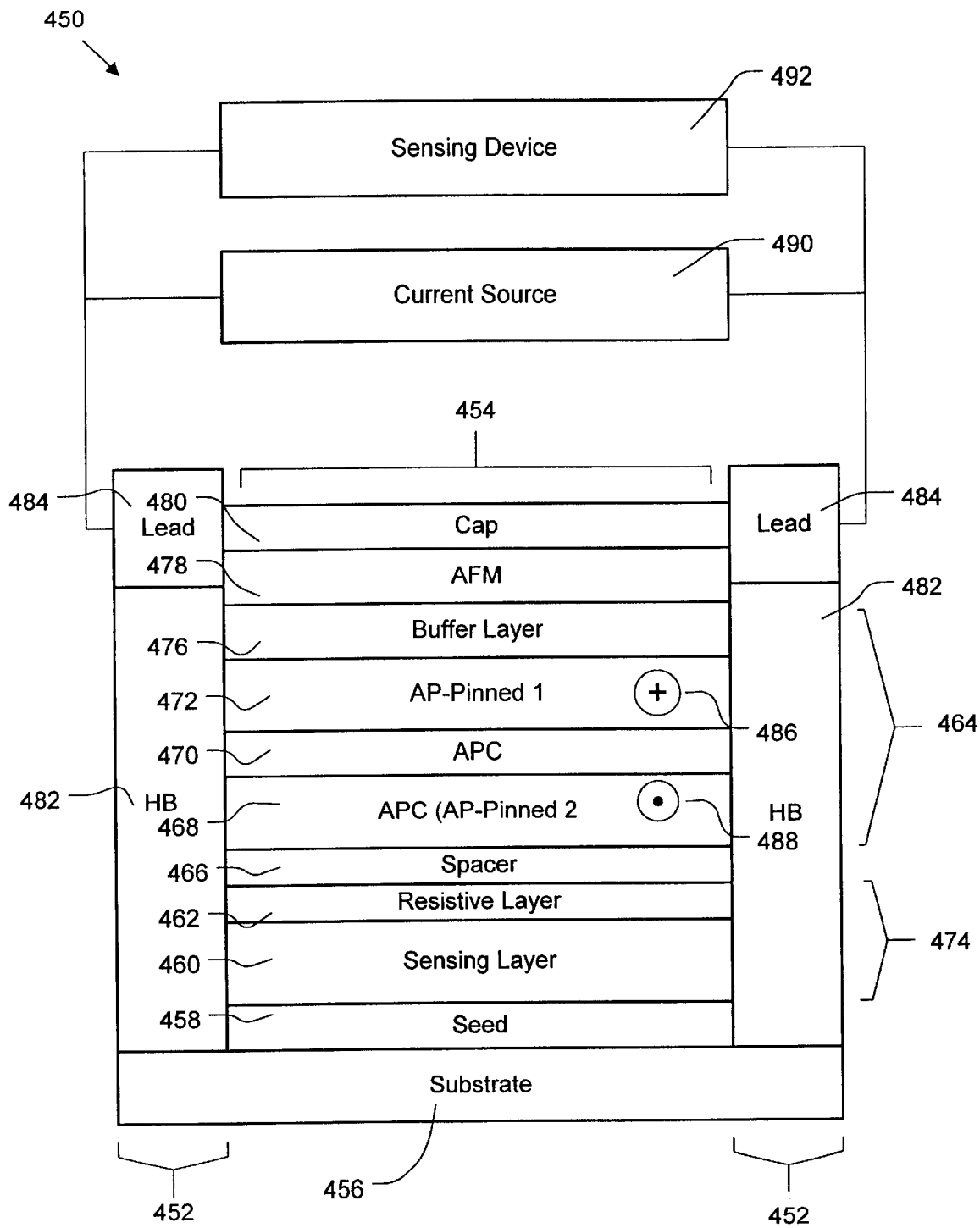
FIG. 6 is a cross-sectional view illustrating the composition of one embodiment of a top AFM spin valve sensor incorporating a buffer layer according to the present invention.

The spin valve sensor 400 of FIG. 5 is a bottom AFM structure. The present invention may also be employed in a top AFM structure, as shown in FIG. 6. The spin valve sensor 450 of FIG. 6 is configured similar to the spin valve sensor of FIG. 5, except that essentially, the order of the layers is reversed. The free, or sensing, layer 460 is shown arranged toward the bottom of the spin valve sensor 450, while the AFM layer is shown disposed toward the top of the spin valve sensor 450. Otherwise, the thicknesses and compositions of the various layers are preferably the same as discussed above for the spin valve sensor 400 of FIG. 5.

From the above discussion, it should be readily apparent that the improved spin valve structure of the present invention improves the GMR coefficient and, therefore the measuring sensitivity of the spin valve. The addition of the buffer layer enhances the measurable resistance changes of the free layer by decreasing the degradation of the pinning field during the annealing process, increasing the resistivity to shunt currents between the pinned and AFM layers and creating a strong FCC texture and creates a good diffusion barrier between the AFM layer and the pinned layer.

The present invention may be embodied in other specific forms without departing from its essential characteristics. The described embodiments are to be considered in all respects as only illustrative and not restrictive. The scope of the invention is, therefore, indicated by the appended claims rather that by the foregoing description. All changes which come within the meaning and range of equivalency of the claims are to be embraced within their scope.

What is claimed and desired to be secured by United States Letters Patent is:

1. A spin valve sensor, comprising:
   a free layer formed of a first ferromagnetic material;
   a pinned layer formed of a second ferromagnetic material;
   a spacer layer interposed between the free layer and the pinned layer, the spacer layer formed of a nonferromagnetic conducting material;
   an antiferromagnetic (AFM) layer; and
   an intervening buffer layer positioned between and directly adjacent to the pinned layer and the AFM layer, the buffer layer comprising an alloy of Ni, Fe, and an element selected from the group consisting of Nb, Mo, Cr, and Ta.

2. The spin valve sensor of claim 1, wherein the AFM layer comprises a Mn alloy.

3. The spin valve sensor of claim 2, wherein the AFM alloy is selected from the group consisting of PtMn, NiMn, PtPdMn, and PtCrMn.

4. The spin valve sensor of claim 1, wherein the buffer layer comprises about 70 to 80 percent Ni and about 15 to 25 percent Fe and about 5 to 10 percent of the element selected from the group consisting of Nb, Mo, Cr and Ta.

5. The spin valve sensor of claims 1, wherein the buffer layer has a thickness in a range of between about 3 Å and about 25 Å.

6. The spin valve sensor of claim 5, wherein the buffer layer is configured to create a barrier against electron diffusion during an annealing of the spin valve sensor.

7. The spin valve sensor of claim 1, wherein the buffer layer comprises NiFeNb.

8. The spin valve sensor of claim 1, wherein the buffer layer comprises NiFeMo.

9. The spin valve sensor of claim 1, wherein the buffer layer comprises NiFeCr.

10. The spin valve sensor of claim 1, wherein the buffer layer comprises NiFeTa.

11. The spin valve sensor of claim 1, wherein the pinned layer comprises Co.

12. The spin valve sensor of claim 1, wherein the pinned layer comprises CoFe.

13. The spin valve sensor of claim 1, further comprising a seed layer containing a face centered cubic material forming a (111) crystallographic plane substantially parallel to a substrate.

14. A spin valve sensor, comprising:

a free layer formed of a first ferromagnetic material;

a pinned layer formed of a second ferromagentic material;

a spacer layer interposed between the free layer and the pinned layer, the spacer layer formed of a nonferromagnetic conducting material;

an antiferromagnetic (AFM) layer comprising a Mn alloy; and an intervening buffer layer positioned between and directly adjacent to the pinned layer and the AFM layer, the buffer layer comprising an alloy of Ni, Fe, and an element selected from the group consisting of Nb, Mo, Cr, and Ta.

15. The spin valve sensor of claim 14, wherein the AFM layer is selected from the group consisting of PtMn, NiMn, PtPdMn, and PtCrMn.

16. The spin valve sensor of claim 15, wherein the buffer layer comprises about 70 to 80 percent Ni and about 15 to 25 percent Fe and about 5 to 10 percent of the element selected from the group consisting of Nb, Mo, Cr and Ta.

17. The spin valve sensor of claim 16, wherein the buffer layer has a thickness of between about 3 Å and 25 Å.

18. The spin valve sensor of claim 17, wherein the buffer layer is configured to create a barrier against electron diffusion during an annealing process of the spin valve sensor.

19. The spin valve sensor of claim 18, wherein the buffer layer comprises NiFeNb.

20. The spin valve sensor of claim 19, wherein the buffer layer comprises NiFeMo.

21. The spin valve sensor of claim 20, wherein the buffer layer comprises NiFeCr.

22. The spin valve sensor of claim 21, wherein the buffer layer comprises NiFeTa.

23. A disk drive system, comprising:

a spin valve sensor, the spin valve sensor comprising:
a free layer formed of a first ferromagnetic material;
a pinned layer formed of a second ferromagnetic material;
a spacer layer interposed between the free layer and the pinned layer, the spacer layer formed of a nonferromagnetic conducting material;
an antiferromagnetic (AFM) layer comprising a Mn alloy; and
an intervening buffer layer positioned between and directly adjacent to the pinned layer and
the AFM layer, the buffer layer comprising an alloy of Ni, Fe, and an element selected from the group consisting of Nb, Mo, Cr, and Ta;

an actuator for moving the spin valve sensor across the magnetic recording disk so the spin valve sensor may access different regions of magnetically recorded data on the magnetic recording disk; and a detector coupled to the spin valve sensor for detecting changes in resistance of the sensor caused by rotation of the magnetization axis of the free ferromagnetic layer relative to the fixed magnetization of the AP pinned layer in response to magnetic fields from the magnetically recorded data.

24. The disk drive system of claim 23, wherein the AFM layer is selected from the group consisting of PtMn, NiMn, PtPdMn, and PtCrMn.

* * * * *

UNITED STATES PATENT AND TRADEMARK OFFICE
CERTIFICATE OF CORRECTION

PATENT NO.     : 6,456,469 B1
DATED          : September 24, 2002
INVENTOR(S)    : Gill It is certified that error appears in the above-identified patent and that said Letters Patent is hereby corrected as shown below:

<u>Title page,</u>
Item [57], ABSTRACT,
Line 3, "(AP) pinned" should read -- (AP)-pinned --.
Line 6, "layer a decreases" should read -- layer decreases --.

<u>Column 2,</u>
Line 46, "antiparallel" should read -- anti-parallel --.

<u>Column 8,</u>
Line 60, "selected its" should read -- selected for its --.

Signed and Sealed this

Thirty-first Day of December, 2002

JAMES E. ROGAN
*Director of the United States Patent and Trademark Office*